United States Patent
Akutsu et al.

(10) Patent No.: US 12,148,803 B2
(45) Date of Patent: Nov. 19, 2024

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Satoshi Akutsu, Yokohama (JP); Takuo Kikuchi, Kamakura (JP); Kazuyuki Ito, Kamakura (JP); Nobuhide Yamada, Yokohama (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 239 days.

(21) Appl. No.: 17/834,462

(22) Filed: Jun. 7, 2022

(65) Prior Publication Data

US 2023/0091870 A1 Mar. 23, 2023

(30) Foreign Application Priority Data

Sep. 17, 2021 (JP) ................. 2021-152265

(51) Int. Cl.
*H01L 29/40* (2006.01)
*H01L 29/78* (2006.01)

(52) U.S. Cl.
CPC ........ *H01L 29/402* (2013.01); *H01L 29/7811* (2013.01); *H01L 29/7842* (2013.01)

(58) Field of Classification Search
CPC .............. H01L 29/402; H01L 29/7811; H01L 29/7842; H01L 29/0696; H01L 29/404;
(Continued)

(56) References Cited

U.S. PATENT DOCUMENTS

2007/0108511 A1* 5/2007 Hirler .................. H01L 29/7813
257/E29.027
2010/0163846 A1* 7/2010 Yilmaz ............... H01L 29/7813
977/938

(Continued)

FOREIGN PATENT DOCUMENTS

JP 2014-187182 10/2014
JP 2016-213374 A 12/2016
JP 2017-139262 8/2017

*Primary Examiner* — Shahed Ahmed
*Assistant Examiner* — Khatib A Rahman
(74) *Attorney, Agent, or Firm* — Oblon, McClelland, Maier & Neustadt, L.L.P.

(57) ABSTRACT

A semiconductor device includes a first electrode, a second electrode, a semiconductor part located between the first electrode and the second electrode, a third electrode located in the semiconductor part, an insulating film located between the third electrode and the semiconductor part, an insulating member located in the semiconductor part at a position separated from the insulating film, a fourth electrode located in the insulating member, and a compressive stress member located in the fourth electrode. The compressive stress member has compressive stress along a first direction. The first direction is from the first electrode toward the second electrode.

7 Claims, 5 Drawing Sheets

(58) Field of Classification Search
CPC ............. H01L 29/407; H01L 29/66734; H01L 29/7843; H01L 29/7813
See application file for complete search history.

(56) References Cited

U.S. PATENT DOCUMENTS

| | | |
|---|---|---|
| 2014/0284773 A1 | 9/2014 | Nishiguchi |
| 2016/0064477 A1* | 3/2016 | Blank ................... H01L 29/407 257/488 |
| 2017/0005171 A1* | 1/2017 | Laforet ............... H01L 29/7813 |
| 2017/0222038 A1 | 8/2017 | Katou et al. |
| 2022/0406937 A1* | 12/2022 | Karner ................ H01L 29/7843 |

\* cited by examiner

SEMICONDUCTOR DEVICE

CROSS-REFERENCE TO RELATED APPLICATIONS

This application is based upon and claims the benefit of priority from Japanese Patent Application No. 2021-152265, filed on Sep. 17, 2021; the entire contents of which are incorporated herein by reference.

FIELD

Embodiments relate to a semiconductor device.

BACKGROUND

Conventionally, a FP-MOSFET (Metal-Oxide-Semiconductor Field-Effect Transistor) has been developed as a semiconductor device for power control in which a field plate electrode is buried in a trench. It is favorable to reduce the on-resistance of such a FP-MOSFET as well.

DETAILED DESCRIPTION

In general, according to one embodiment, a semiconductor device includes a first electrode, a second electrode, a semiconductor part located between the first electrode and the second electrode, a third electrode located in the semiconductor part, an insulating film located between the third electrode and the semiconductor part, an insulating member located in the semiconductor part at a position separated from the insulating film, a fourth electrode located in the insulating member, and a compressive stress member located in the fourth electrode. The compressive stress member has compressive stress along a first direction. The first direction is from the first electrode toward the second electrode.

Embodiments of the invention will now be described with reference to the drawings.

Figure 1:
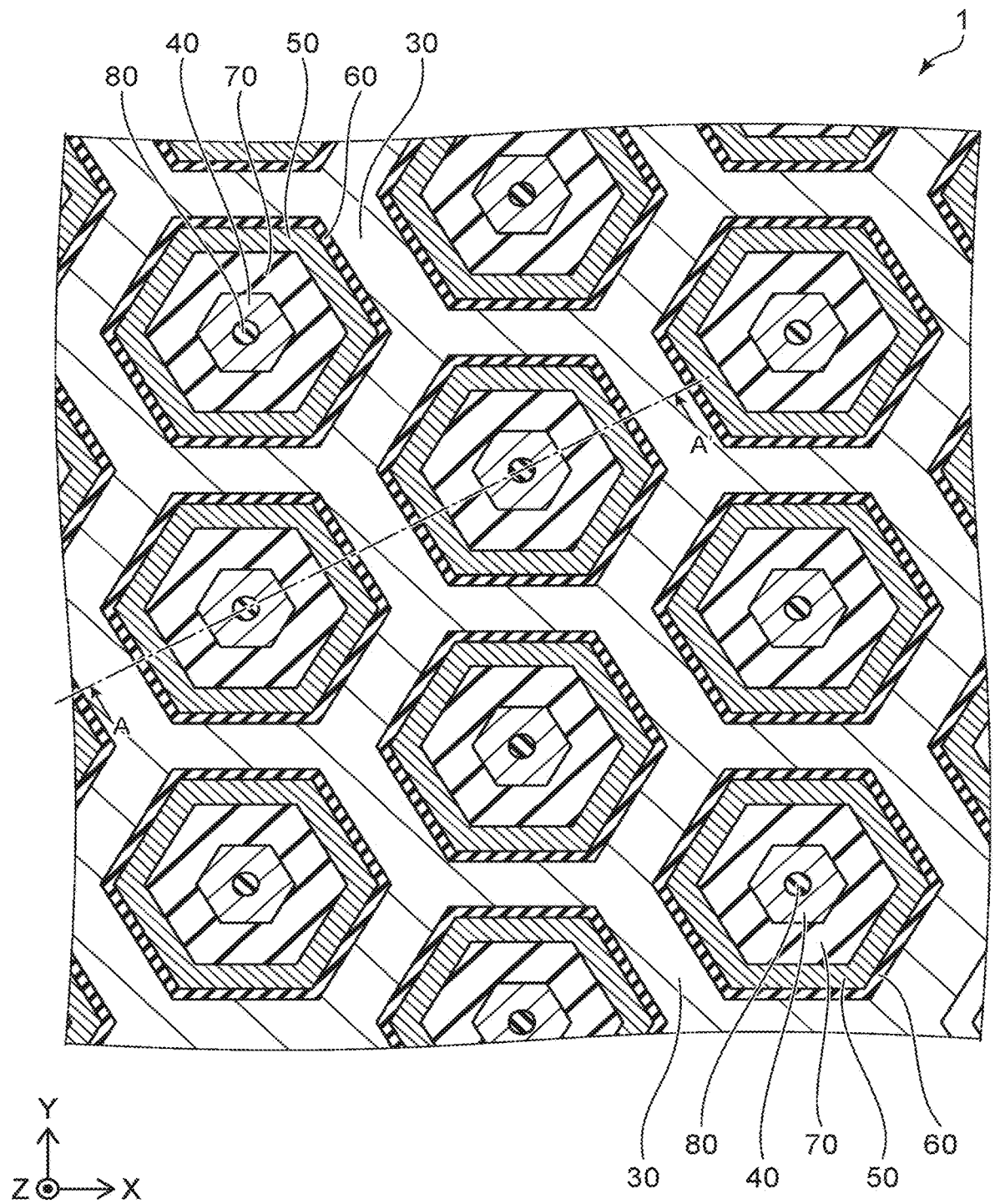
FIG. 1 is a plan view showing a semiconductor device according to an embodiment.

FIG. 1 is a plan view showing a semiconductor device according to the embodiment.

Figure 2:
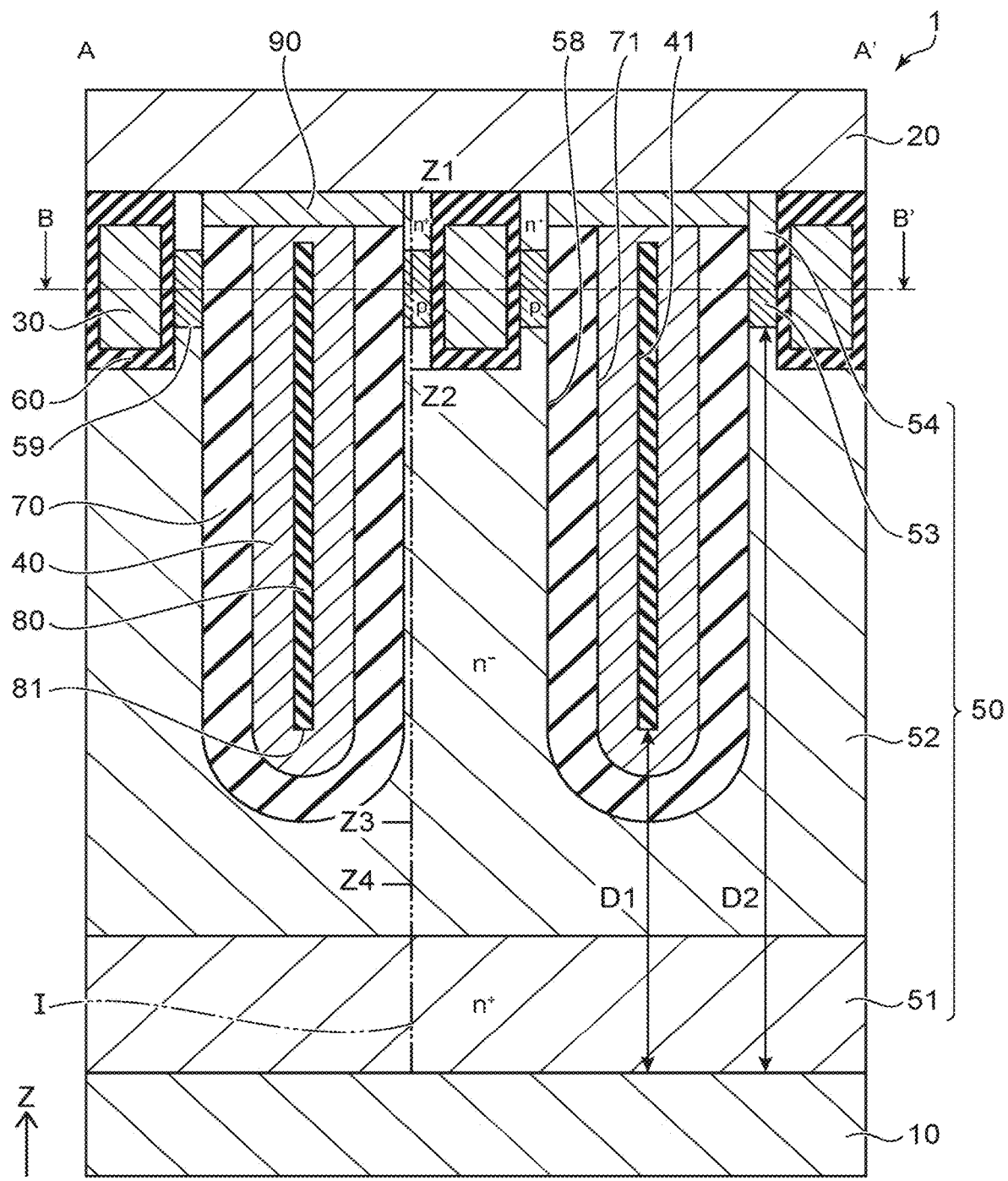
FIG. 2 is a cross-sectional view along line A-A' shown in FIG. 1.

FIG. 2 is a cross-sectional view along line A-A' shown in FIG. 1.

Figure 3:
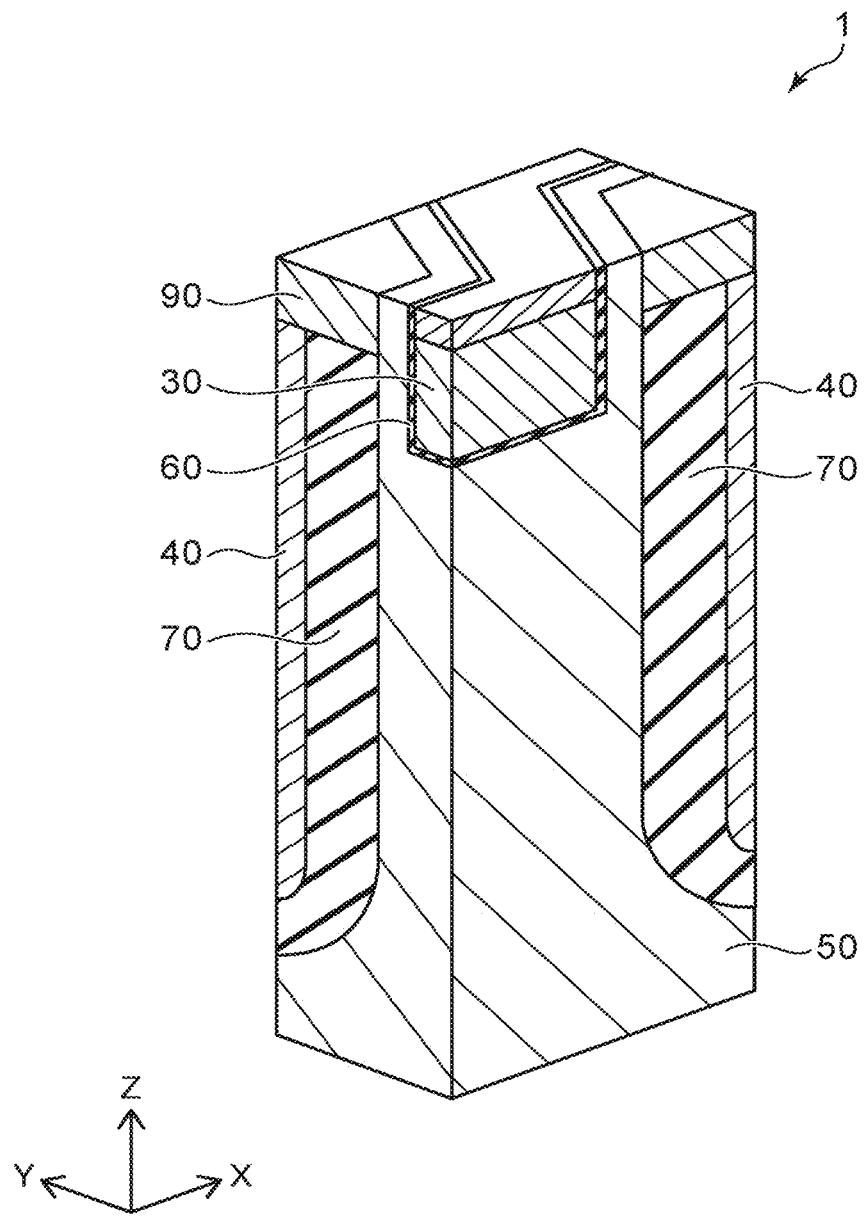
FIG. 3 is a perspective cross-sectional view showing the semiconductor device according to the embodiment.

FIG. 3 is a perspective cross-sectional view showing the semiconductor device according to the embodiment.

Figures 4A, 4B:
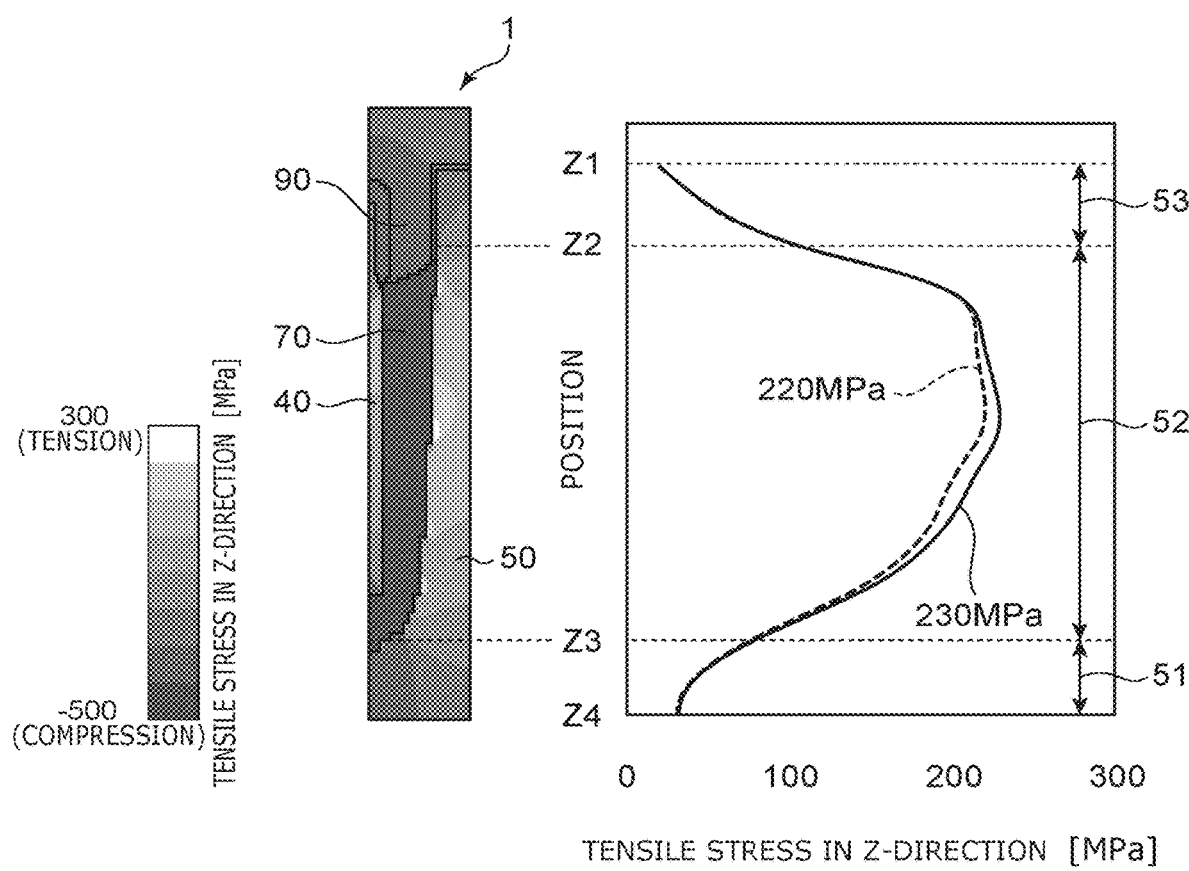
FIG. 4A shows the stress distribution in the semiconductor device.
FIG. 4B is a graph showing the stress distribution in a semiconductor part, in which the vertical axis is the position in the Z-direction, and the horizontal axis is the tensile stress in the Z-direction.

FIG. 4A shows the stress distribution in the semiconductor device; and FIG. 4B is a graph showing the stress distribution in a semiconductor part, in which the vertical axis is the position in the Z-direction, and the horizontal axis is the tensile stress in the Z-direction.

Figure 5:
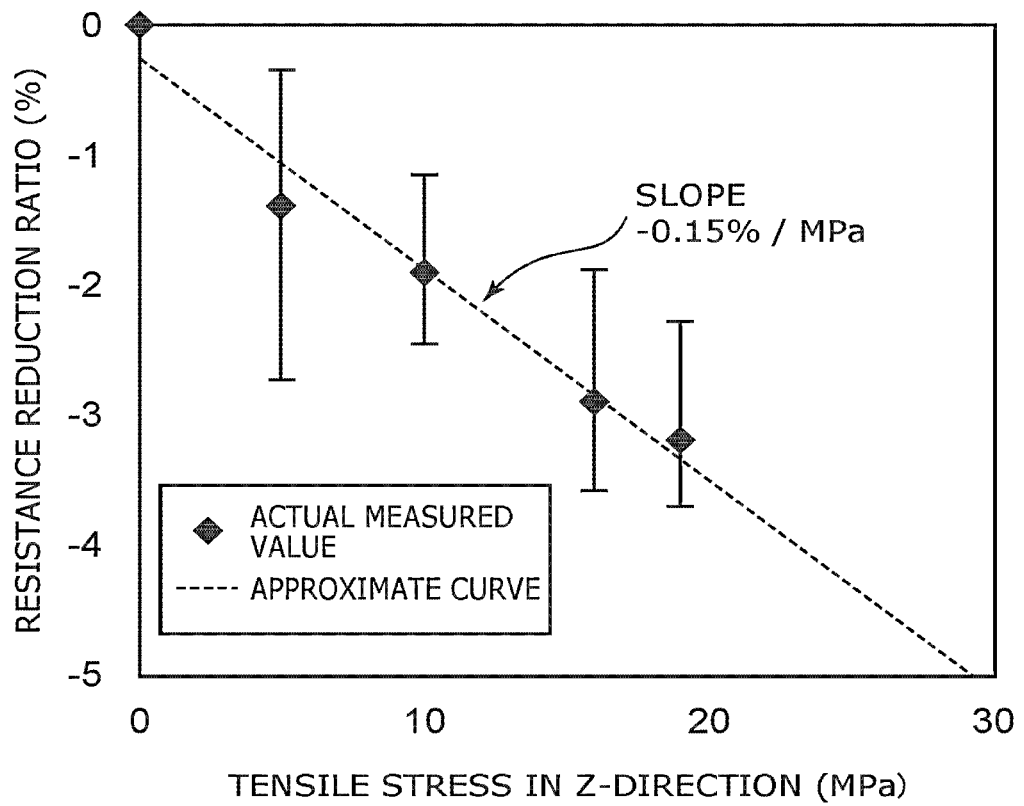
FIG. 5 is a graph showing the effects of the tensile stress of the semiconductor part on the resistance value, in which the horizontal axis is the tensile stress in the Z-direction, and the vertical axis is the resistance reduction ratio.

FIG. 5 is a graph showing the effects of the tensile stress of the semiconductor part on the resistance value, in which the horizontal axis is the tensile stress in the Z-direction, and the vertical axis is the resistance reduction ratio.

FIG. 1 is a cross-sectional view along line B-B' shown in FIG. 2. The position in the Z-direction shown in FIG. 4B corresponds to FIG. 4A. Positions Z1 to Z4 in the Z-direction correspond to the positions Z1 to Z4 shown in FIG. 2. The drawings are schematic and are enhanced or simplified as appropriate. The dimensional ratios of the components may be different from those of the actual product and do not necessarily match between the drawings.

As shown in FIGS. 1 to 3, a semiconductor device 1 according to the embodiment is a FP-MOSFET. The semiconductor device 1 includes a drain electrode 10 (a first electrode), a source electrode 20 (a second electrode), a gate electrode 30 (a third electrode), a field plate electrode 40 (a fourth electrode), a semiconductor part 50, a gate insulating film 60 (an insulating film), an insulating member 70, a compressive stress member 80, and a plug 90.

In the specification, an XYZ orthogonal coordinate system is employed for convenience of description. The direction from the drain electrode 10 toward the source electrode 20 is taken as a "Z-direction" (a first direction); and two mutually-orthogonal directions that are orthogonal to the Z-direction are taken as an "X-direction" and a "Y-direction". Among the Z-directions, a direction that is from the drain electrode 10 toward the source electrode 20 also is called "up", and the opposite direction also is called "down"; however, these expressions are for convenience and are independent of the direction of gravity.

The drain electrode 10 and the source electrode 20 are separated from each other. The semiconductor part 50 is located between the drain electrode 10 and the source electrode 20. Multiple insulating members 70 are located in the upper portion of the semiconductor part 50, i.e., the portion at the source electrode 20 side. A portion of the semiconductor part 50 is interposed between the drain electrode 10 and the insulating member 70; and the semiconductor part 50 is not interposed between the source electrode 20 and the insulating member 70.

The insulating member 70 is formed of an insulating material, e.g., silicon oxide. For example, each insulating member 70 has a columnar shape with the Z-direction as the longitudinal direction, and has, for example, a hexagonal prism shape, e.g., a regular hexagonal prism shape. In other words, when viewed along the Z-direction, the shape of the insulating member 70 is, for example, hexagonal, e.g., regular hexagonal.

When viewed along the Z-direction, for example, the multiple insulating members 70 are arranged periodically along three directions at angles of 120 degrees from each other. In the example shown in FIG. 1, one of the three directions is the Y-direction. Thereby, the multiple insulating members 70 are located so that the centers of the three most proximate insulating members 70 are at the vertices of an equilateral triangle. When viewed along the Z-direction, the sides of the insulating member 70 face the sides of adjacent insulating members 70.

One field plate electrode 40 (hereinbelow, called the "FP electrode 40") is located in each insulating member 70. For example, the FP electrode 40 has a columnar shape with the Z-direction as the longitudinal direction, and has, for example, a hexagonal prism shape. The lower end of the FP electrode 40 is covered with the insulating member 70. The FP electrode 40 is separated from the semiconductor part 50 by the insulating member 70. For example, the FP electrode 40 is made of polysilicon that includes an impurity. The plug 90 is located between the FP electrode 40 and the source electrode 20. Thereby, the FP electrode 40 is connected to the source electrode 20 via the plug 90. In the specification, "connected" means an electrical connection.

One compressive stress member 80 is located in each FP electrode 40. For example, the compressive stress member 80 has a columnar shape with the Z-direction as the longitudinal direction. When viewed along the Z-direction, for example, the compressive stress member 80 is circular, hexagonal, or hexagonal with rounded corners. For example, the lower end of the compressive stress member 80 is covered with the FP electrode 40. In each insulating member 70, the central axis of the insulating member 70, the central axis of the FP electrode 40, and the central axis of the compressive stress member 80 substantially match.

The compressive stress member 80 has compressive stress along the Z-direction. In other words, the compressive stress member 80 stretches the objects at the periphery along the Z-direction. Thereby, a tensile stress along the Z-direction is applied to the semiconductor part 50. The material of the compressive stress member 80 is not particularly limited as long as the material generates compressive stress along the Z-direction; for example, the material can include silicon oxide, silicon nitride, or aluminum oxide. Or, the compressive stress member 80 may be formed of a metal.

The gate electrode 30 is located in the upper portion of the semiconductor part 50, i.e., the portion at the source electrode 20 side. The gate electrode 30 is located between the multiple insulating members 70. When viewed along the Z-direction, for example, the gate electrode 30 has a honeycomb shape that faces the sides of the insulating member 70.

The gate insulating film 60 covers the gate electrode 30 and is located between the gate electrode 30 and the semiconductor part 50 and between the gate electrode 30 and the source electrode 20. The gate insulating film 60 is separated from the insulating member 70. In other words, a portion of the semiconductor part 50 is interposed between the gate insulating film 60 and the insulating member 70. Accordingly, the gate insulating film 60, the semiconductor part 50, and the insulating member 70 are interposed between the gate electrode 30 and the FP electrode 40.

The semiconductor part 50 includes a drain layer 51 of the $n^+$-conductivity type, a drift layer 52 of the $n^-$-conductivity type, a base layer 53 (a third semiconductor layer) of the p-conductivity type, and a source layer 54 (a second semiconductor layer) of the $n^+$-conductivity type. The drain layer 51 and the drift layer 52 together are also called the "first semiconductor layer". The drain layer 51 is connected to the drain electrode 10. The drift layer 52 is located on the drain layer 51 and contacts the drain layer 51. The base layer 53 is located on the drift layer 52 and contacts the drift layer 52. The source layer 54 is located on the base layer 53 and contacts the base layer 53. In other words, the base layer 53 is located between the drift layer 52 and the source layer 54. The source layer 54 is connected to the source electrode 20.

A lower end 81 of the compressive stress member 80 is positioned lower than a p-n interface 59 between the drift layer 52 and the base layer 53. Accordingly, a distance D1 between the drain electrode 10 and the compressive stress member 80 is less than a distance D2 between the drain electrode 10 and the base layer 53. In other words, D1<D2.

An example of a method for forming the compressive stress member 80 will now be described.

Trenches 58 are formed in a dot configuration in the semiconductor part 50. The shape of each trench 58 when viewed along the Z-direction is hexagonal, e.g., regular hexagonal. The lower end of each trench 58 is positioned in the drift layer 52 or in the drain layer 51 and does not reach the drain electrode 10. The multiple trenches 58 are arranged at uniform spacing along three directions at angles of 120 degrees from each other.

Then, silicon oxide is deposited on the inner surface of the trench 58 by, for example, CVD (Chemical Vapor Deposition) using TEOS (tetraethyl orthosilicate ($Si(OC_2H_5)_4$)) as a raw material. The silicon oxide does not completely fill the interior of the trench 58. Thereby, the insulating member 70 is formed along the inner surface of the trench 58. A recess 71 that reflects the inner surface shape of the trench 58 is formed in the insulating member 70.

Continuing, silicon is deposited on the inner surface of the insulating member 70. The silicon does not completely fill the interior of the recess 71. Thereby, the FP electrode 40 is formed along the inner surface of the insulating member 70. A seam 41 is formed in the FP electrode 40.

Then, thermal oxidation treatment is performed. Thereby, thermal oxidation of the portion of the silicon of the FP electrode 40 exposed in the seam 41 is performed to form silicon oxide. As a result, the compressive stress member 80 that is made of silicon oxide is formed in the seam 41 of the FP electrode 40. Compressive stress is generated in the compressive stress member 80 by the volume expansion when the silicon is oxidized. Compressive stress also is generated in the Z-direction.

Or, silicon oxide is deposited in the seam 41 by CVD using TEOS as a raw material after opening the upper portion of the seam 41 by etching. This also forms the compressive stress member 80 made of silicon oxide in the seam 41. According to the film formation conditions of the silicon oxide at this time, compressive stress along the Z-direction can be generated in the compressive stress member 80.

Or, silicon nitride or aluminum oxide is deposited in the seam 41. Thereby, the compressive stress member 80 that is made of silicon nitride or aluminum oxide is formed in the seam 41. In such a case as well, compressive stress along the Z-direction can be generated in the compressive stress member 80 according to the film formation conditions of the silicon nitride or the aluminum oxide. The method for forming the compressive stress member 80 is not limited to these examples.

Operations of the semiconductor device 1 according to the embodiment will now be described.

A voltage such that the drain electrode 10 is positive and the source electrode 20 is negative is applied between the drain electrode 10 and the source electrode 20. At this time, the same potential as the source electrode 20 is applied to the FP electrode 40. Thereby, a depletion layer is generated from the p-n interface 59 between the drift layer 52 and the base layer 53 and the side surface of the insulating member 70 as starting points.

When a potential that is greater than a threshold is applied to the gate electrode 30 in this state, an inversion layer is formed in the portion of the base layer 53 contacting the gate insulating film 60. As a result, the semiconductor device 1 is set to the "on-state"; and a current flows from the drain electrode 10 to the source electrode 20 via the drain layer 51, the drift layer 52, the inversion layer in the base layer 53, and the source layer 54. The current path is called a "current path I".

On the other hand, the inversion layer disappears when a potential that is less than the threshold is applied to the gate electrode 30. As a result, the semiconductor device 1 is set to the "off-state"; and the current that flows from the drain electrode 10 to the source electrode 20 is blocked. At this time, the concentration of the electric field in the semiconductor part 50 is relaxed because the same potential as the source electrode 20 is applied to the FP electrode 40.

Then, as shown in FIGS. 4A and 4B, tensile stress along the Z-direction is applied to the semiconductor part 50 because the compressive stress member 80 has compressive stress along the Z-direction. The broken line shown in FIG. 4B illustrates a comparative example that does not include the compressive stress member 80; and the solid line illustrates the embodiment that includes the compressive stress member 80. As shown in FIGS. 4A and 4B, by including the compressive stress member 80, the tensile stress along the Z-direction is increased in the semiconductor part 50, and particularly in the mesa region between the adjacent insulating members 70.

As shown in FIG. 5, the electrical resistance of the semiconductor part 50 decreases as the tensile stress increases. As described above, by increasing the tensile stress in the Z-direction particularly in the mesa region, the Z-direction electrical resistance of the mesa region is reduced. As a result, the resistance value (the on-resistance) in the current path I from the drain electrode 10 toward the source electrode 20 in the on-state can be reduced.

Effects of the embodiment will now be described.

According to the embodiment, by including the compressive stress member 80, the tensile stress along the Z-direction can be applied to the semiconductor part 50 and particularly to the mesa region; and the on-resistance can be reduced. The on-resistance can be effectively reduced because the mesa region occupies a large percentage of the current path I.

When the compressive stress member 80 is formed by an insulating material such as silicon oxide, etc., there is a possibility that the on-resistance would be increased if the compressive stress member 80 were interposed in the current path I. Conversely, according to the embodiment, the compressive stress member 80 is located in the FP electrode 40; therefore, the compressive stress member 80 is not interposed in the current path I. Therefore, the on-resistance is not reduced even when the compressive stress member 80 is formed of an insulating material.

According to the embodiment, when viewed along the Z-direction, the insulating members 70 are hexagonal; the sides of the adjacent insulating members 70 face each other; and the gate electrode 30 is located between the insulating members 70. Therefore, when viewed along the Z-direction, the surface area of the inversion layer occupies a large percentage of the semiconductor part 50. The on-resistance can be reduced thereby.

According to embodiments described above, a semiconductor device can be realized in which the on-resistance can be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a first electrode;
   a second electrode;
   a semiconductor part located between the first electrode and the second electrode;
   a third electrode located in the semiconductor part;
   an insulating film located between the third electrode and the semiconductor part;
   an insulating member located in the semiconductor part at a position separated from the insulating film;
   a fourth electrode located in the insulating member; and
   a compressive stress member located in the fourth electrode, the compressive stress member having compressive stress along a first direction, and the first direction being from the first electrode toward the second electrode, wherein
   a plurality of the insulating members is included,
   the insulating members are hexagonal when viewed along the first direction; and
   the third electrode is located between the insulating members.

2. The device according to claim 1, wherein
   tensile stress along the first direction is applied to the semiconductor part.

3. The device according to claim 1, wherein
   the compressive stress member includes silicon oxide, silicon nitride, or aluminum oxide.

4. The device according to claim 1, wherein
   the compressive stress member has a columnar shape with the first direction as a longitudinal direction.

5. The device according to claim 1, wherein
   when viewed along the first direction, the fourth electrode is hexagonal and is located in the insulating member.

6. The device according to claim 1, wherein
   the fourth electrode is connected to the second electrode.

7. The device according to claim 1, wherein
   the semiconductor part includes:
   a first semiconductor layer connected to the first electrode, the first semiconductor layer being of a first conductivity type;
   a second semiconductor layer connected to the second electrode, the second semiconductor layer being of the first conductivity type; and
   a third semiconductor layer located between the first semiconductor layer and the second semiconductor layer, the third semiconductor layer being of a second conductivity type, and
   a distance between the first electrode and the compressive stress member is less than a distance between the first electrode and the third semiconductor layer.

* * * * *